United States Patent
Jacobs et al.

(10) Patent No.: US 10,701,820 B1
(45) Date of Patent: Jun. 30, 2020

(54) TAMPER PROOF APPROACHES FOR SECURING AN ENCLOSURE

(71) Applicant: FISHER CONTROLS INTERNATIONAL LLC, Marshalltown, IA (US)

(72) Inventors: Gregory W. Jacobs, Marshalltown, IA (US); James S. Davis, Marshalltown, IA (US); Roger L. Heatwole, Marshalltown, IA (US)

(73) Assignee: FISHER CONTROLS INTERNATIONAL LLC, Marshalltown, IA (US)

( * ) Notice: Subject to any disclaimer, the term of this patent is extended or adjusted under 35 U.S.C. 154(b) by 0 days.

(21) Appl. No.: 15/929,141

(22) Filed: Jun. 6, 2019

(51) Int. Cl.
  H05K 5/02 (2006.01)
  H05K 5/06 (2006.01)
  H05K 5/00 (2006.01)

(52) U.S. Cl.
  CPC ......... H05K 5/0208 (2013.01); H05K 5/0008 (2013.01); H05K 5/061 (2013.01)

(58) Field of Classification Search
  CPC combination set(s) only.
  See application file for complete search history.

(56) References Cited

U.S. PATENT DOCUMENTS

| | | | | |
|---|---|---|---|---|
| 4,426,108 A * | 1/1984 | Kesselman | ............. | F16B 41/00 174/92 |
| 4,777,812 A * | 10/1988 | Haugen | ................. | F16B 41/005 292/251 |
| 5,656,782 A * | 8/1997 | Powell, II | ............... | G01L 19/14 73/756 |
| 6,736,162 B2 * | 5/2004 | Schimnowski | ........... | F16K 1/46 137/541 |
| 6,970,360 B2 * | 11/2005 | Sinha | ...................... | G06F 21/86 174/541 |
| 7,348,499 B1 * | 3/2008 | Cox | ......................... | H02B 1/48 174/549 |
| 7,443,313 B2 * | 10/2008 | Davis | .................... | G08B 13/149 340/539.26 |
| 9,182,266 B2 * | 11/2015 | Yuan | ........................ | G01F 23/38 |
| 9,320,356 B2 * | 4/2016 | Ralstin | ................. | H05K 5/0208 |
| 9,904,811 B2 * | 2/2018 | Campbell | ............... | G06F 21/86 |
| 9,908,556 B2 * | 3/2018 | Scholten | ............... | H05K 5/0065 |
| 2002/0014962 A1 * | 2/2002 | Miglioli | ............... | G08B 13/149 340/571 |
| 2005/0247169 A1 * | 11/2005 | Faries, Jr. | ............. | B25B 13/485 81/176.15 |

(Continued)

*Primary Examiner* — Lisa Lea-Edmonds
(74) *Attorney, Agent, or Firm* — Marshall, Gerstein & Borun LLP

(57) ABSTRACT

A tamper proof control system includes a housing, and a cap. The housing includes a housing body defining an interior volume to accommodate an electronic process control device and further includes a first end having a housing threaded portion. The cap includes a cap body that defines an interior volume and further includes a proximal end, a cap threaded portion, an exterior surface, and at least one groove formed on the exterior surface. The proximal end of the cap body defines a coupling portion. Upon threadably securing the cap to the housing, the coupling portion of the cap engages the housing threaded portion to restrict relative rotation between the housing and the cap.

18 Claims, 8 Drawing Sheets

(56) References Cited

U.S. PATENT DOCUMENTS

| | | | |
|---|---|---|---|
| 2011/0273852 A1* | 11/2011 | Debrody | G09F 3/0317 361/747 |
| 2013/0058052 A1* | 3/2013 | Arshad | G06F 21/86 361/737 |
| 2015/0036267 A1* | 2/2015 | Miller | H02B 1/03 361/625 |
| 2015/0240965 A1* | 8/2015 | Arnold | F16K 31/163 251/58 |

* cited by examiner

TAMPER PROOF APPROACHES FOR SECURING AN ENCLOSURE

FIELD OF THE DISCLOSURE

The present invention relates generally to tamper proof enclosures, and, more specifically, to a tamper proof enclosure for use in securing a multi-piece electronics enclosure for a process control device.

BACKGROUND

Process control devices are typically used to control, measure, and/or perform other functions within a process such as opening or closing valves and measuring process parameters. For example, some process control devices may control the pressure of control fluid used to position a pneumatically-controlled device, such as a regulator. For example, an electro-pneumatic controller can be used to control a field device associated with the controller, which may be, for example, valves, valve positioners, switches, transmitters, and sensors (e.g., temperature, pressure, and flow rate sensors). In some forms, these controllers may control the pressure of control fluid into a pneumatic actuator of a process control valve or regulator to position the process control valve or regulator. For example, a valve may open or close in response to a control output received from a controller, or may transmit to a controller a measurement of a process parameter so that the controller can utilize the measurement as a control input. In some cases, the controllers may be used in hazardous environments that are susceptible to damage. Further, the controllers and regulators may use fluids that are flammable or explosive in nature. In such cases, components that may potentially ignite are contained within explosion proof enclosure in order to contain a spark and/or fire therein, thus protecting the installed, potentially flammable environment as well as other control instruments to ensure proper operation.

These enclosures must be properly closed or secured to ensure a proper seal is obtained. Further, such enclosures are not typically intended to allow access to the components contained therein once the enclosure is properly sealed. Some explosion resistant enclosures may be designed according to varying standards that provide a certification that a flame will not propagate to a region outside of the enclosure. Examples of standards include a minimum treacherous path distance and a minimum quantity of engaged threads when the enclosure is secured using fasteners such as bolts and/or screws. In these arrangements, a secondary securing component such as a set screw or other arrangement may be used to prevent the bolt from loosening. However, these secondary securing components may reduce the number of engaged threads in the fastener, which could result in the arrangement no longer adhering to required standards. Additionally, some existing arrangements may resemble other fasteners that are used in process control environments, and as such, operators may inadvertently attempt to gain access to components within the explosion resistant enclosure, and as a result, may adversely impact the ability of the enclosure to contain the spark and/or fire.

SUMMARY

In accordance with one aspect, a tamper proof control system includes a housing, and a cap. The housing includes a housing body defining an interior volume to accommodate an electronic process control device and further includes a first end having a housing threaded portion. The cap includes a cap body that defines an interior volume and further includes a proximal end, a cap threaded portion, an exterior surface, and at least one groove formed on the exterior surface. The proximal end of the cap body defines a coupling portion. Upon threadably securing the cap to the housing, the coupling portion of the cap engages the housing threaded portion to restrict relative rotation between the housing and the cap.

In some forms, the system may further include an application tool having an application tool body that defines an interior volume and at least one protrusion extending from a surface of the application tool body. The interior volume accommodates at least a portion of the cap body. The cap is adapted to be placed within the interior volume of the tool body such that the at least one protrusion of the application tool body is axially aligned with the at least one groove of the cap body. In some of these examples, the at least one protrusion of the application tool exerts a torque on the at least one groove of the cap to threadably secure the cap to the housing.

The system may additionally include a securing tool that has a securing tool body and a first end having a securing portion. The securing tool body defines an interior volume to accommodate at least a portion of the housing. Upon inserting the housing into the interior volume of the securing tool body, the securing portion engages the coupling portion of the cap to urge the coupling portion of the cap into engagement with the housing threaded portion. In some examples, the securing portion includes an annular bevel that extends around at least a portion of the securing tool body. An urging force is exerted on the securing tool to urge the coupling portion of the cap into engagement with the housing threaded portion. In some examples, this urging force is between approximately 4,000 psi and approximately 10,000 psi.

In some approaches, the at least one groove forms a circular cross-section, though any number of shapes and/or configurations are possible. In some examples, a plurality of grooves are formed on the cap body that are positioned radially about the exterior surface of the cap body. In any of these examples, the system may include a seal member that is positioned within the interior volume of the cap body to sear the interior volume. An electronic process control device may be at least partially disposed within the interior volume of the housing and the interior volume of the cap.

In some approaches, the coupling portion of the cap may have a first thickness. At least a portion of the remainder of the cap body has a second thickness. The first thickness is less than the second thickness.

In accordance with another aspect, a method of sealing a tamper proof device includes placing at least one electronic process control device within an interior volume of a housing. The housing further includes a housing body and a first end that has a housing threaded portion. The method further includes threadably coupling the housing threaded portion to the cap threaded portion, and urging the coupling portion of the cap body into engagement with the housing threaded portion such that relative rotation between the housing and the cap is restricted.

So configured, the enclosure is sealed such that it will properly contain explosions therein, thus adhering to required standards and/or regulations while remaining tamper proof by not providing access to the interior volume thereof absent applying destructive forces. The secondary process of securing the cap to the housing does not require external fasteners that can be inadvertently removed.

BRIEF DESCRIPTION OF THE DRAWINGS

The above needs are at least partially met through provision of the tamper proof approaches for securing an enclosure described in the following detailed description, particularly when studied in conjunction with the drawings, wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
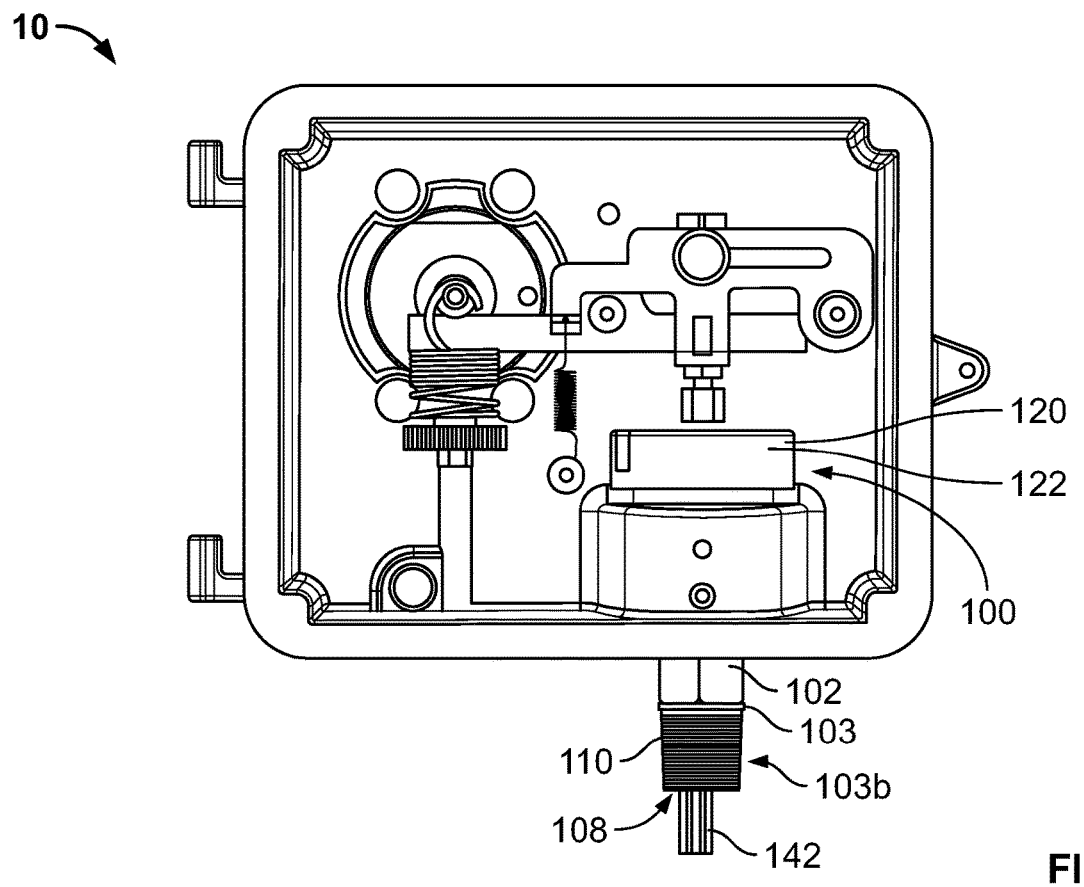
FIG. 1 illustrates an example process control system having an example tamper proof enclosure that includes a cap and a housing in accordance with various embodiments.

As illustrated in FIG. 1, a controller 10 is provided that includes a tamper proof control system 100. The controller 10 can be of any type, such as, for example, an electric level controller, though other types of controllers may be used having any number of configurations and/or components. Such a controller can include any number of components to assist in its operation including, for example, switches, levers, a plunger, a displacer rod, and/or any number of adjustment mechanisms. However, for the sake of brevity, these components will not be discussed in substantial detail besides noting that any number of the components may be at least partially disposed within a shell or housing.

The controller 10 may be used to control a fluid flow device having any number of fluid flow lines and/or connections which supply fluid to downstream components. In some examples, such fluid flow devices may be in the form of actuators, regulators, and the like. Other examples are possible.

Turning to FIGS. 2a-6, the tamper proof control system 100 includes a housing 102 and a cap 120 that may be permanently affixed to the housing 102. As previously noted, the tamper proof control system 100 is considered explosion resistant and/or explosion proof, meaning the system 100 is capable of withstanding a threshold internal pressure (which may be a used as a proxy for being capable containing an explosion therein). In some examples, such a system 100 may be designed to be in conformance with one or more standards, such as International Electrotechnical Commission (IEC) 60079 and/or 60079-1. To determine whether a housing 102 and cap 120 arrangement is capable of containing an explosion therein, testing may be conducted where a detonation is initiated within the housing 102 while measuring the resulting pressure. The housing 102 must be able to withstand a safety factor beyond this resulting pressure. For example, a supply pressure of up to 120 psig/8.2 bar, with 110 psig/7.5 bar being typical, may be provided to the housing 102. A threshold internal pressure may be approximately three to approximately 15 times this supply pressure. Accordingly, the housing 102 may have any number of suitable dimensions and/or configurations to withstand this threshold pressure, such as having a specified thickness (e.g., approximately 10 mm), materials (e.g., aluminum and/or steel), number of thread engagements between the housing 102 and the cap 120 (as will be discussed later), and the like. Of course, this is but one measure and standard by which to define a housing as explosion proof or explosion resistant, and those of ordinary skill in the art will understand and recognize alternative measures and standards.

In the illustrated examples, the housing 102 includes a housing body 103 having a first end 103a and a second end 103b. The first end 103a of the housing body 103 includes a housing threaded portion 104. The housing body 103 is in the form of a shell that defines an interior volume 105 and can include any number of features such as steps and/or ledges 106 and the like. The second end 103b of the housing body 103 defines an opening 108 and an additional coupling region 110 that allows the controller 10 to be coupled to additional components in the fluid flow control device system.

Figure 2A:
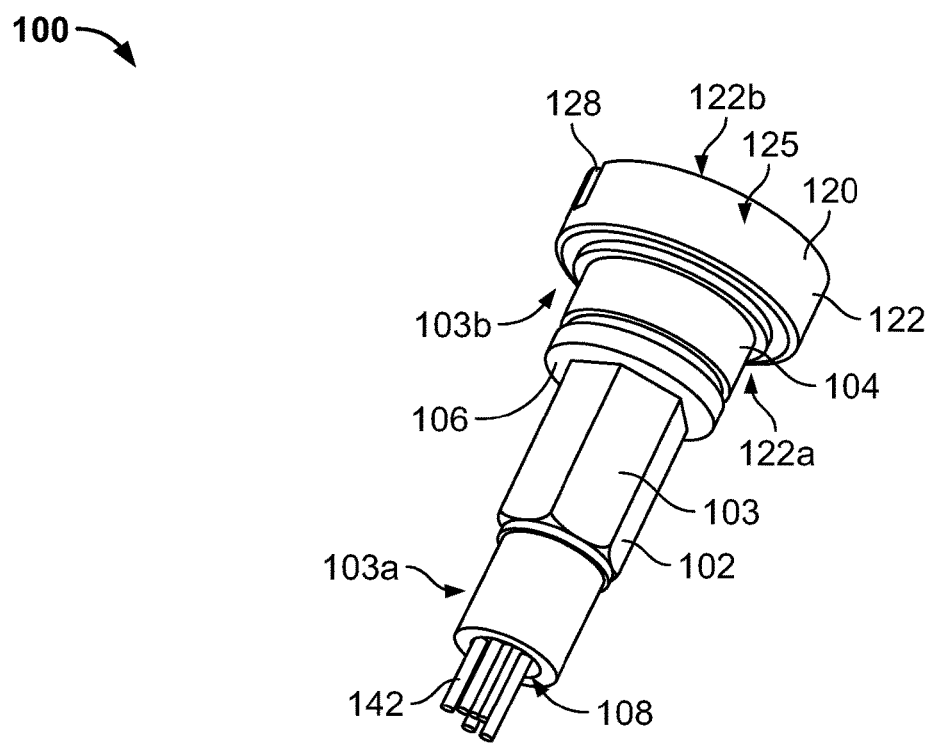
FIG. 2a illustrates a perspective view of the example tamper proof enclosure of FIG. 1 in accordance with various embodiments.
Figure 2B:
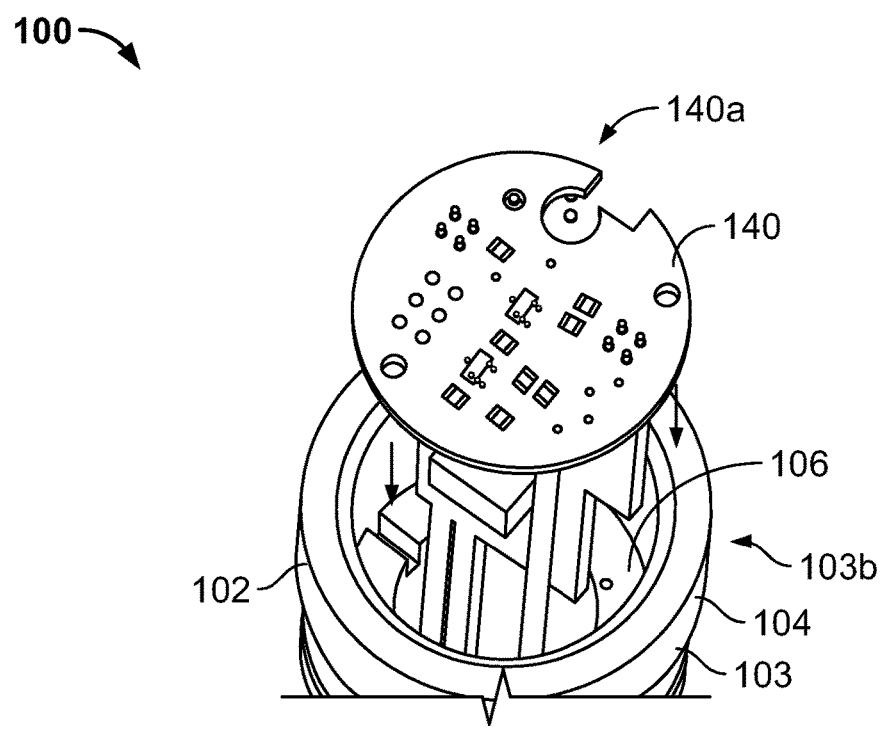
FIG. 2b illustrates a perspective view of the example tamper proof enclosure of FIGS. 1 and 2a having an example electronic process control device being inserted therein in accordance with various embodiments.
Figure 3:
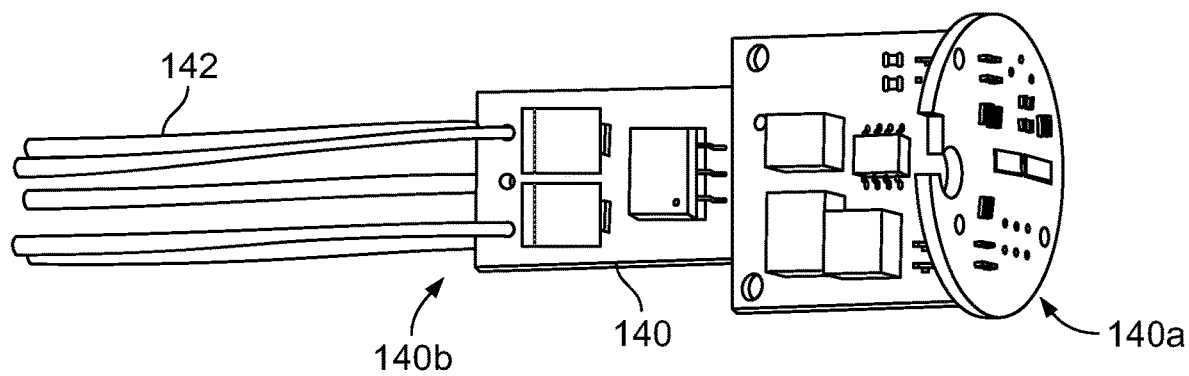
FIG. 3 illustrates a perspective view of the example electronic process control device for the example tamper proof enclosure of FIGS. 1 and 2 in accordance with various embodiments.
Figure 4:
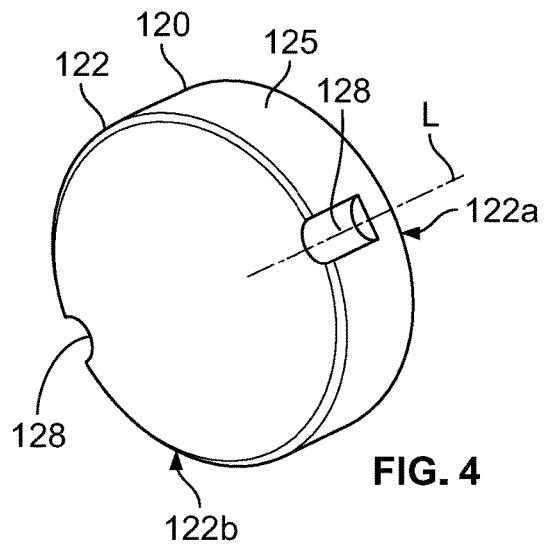
FIG. 4 illustrates an upper perspective view of an example cap for the example tamper proof enclosure of FIGS. 1-3 in accordance with various embodiments.
Figure 5:
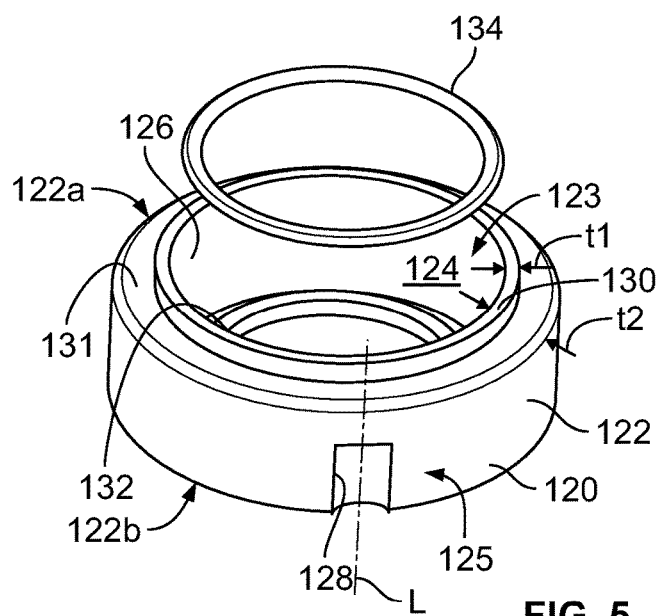
FIG. 5 illustrates a first lower perspective view of the example cap of FIG. 4 in accordance with various embodiments.
Figure 6:
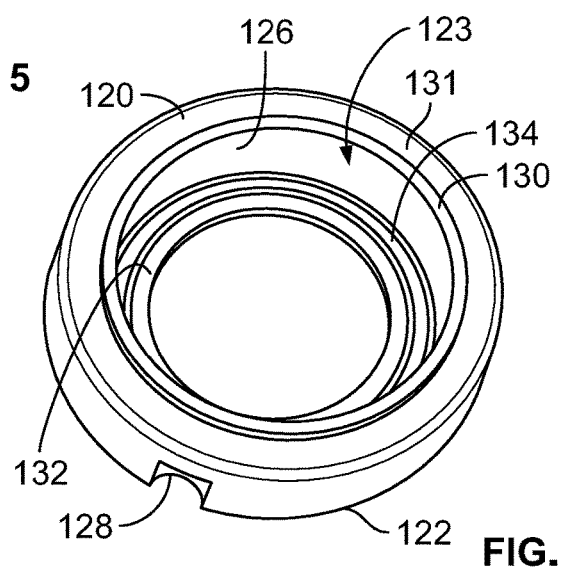
FIG. 6 illustrates a second lower perspective view of the example cap of FIGS. 4 and 5 in accordance with various embodiments.
Figure 7:
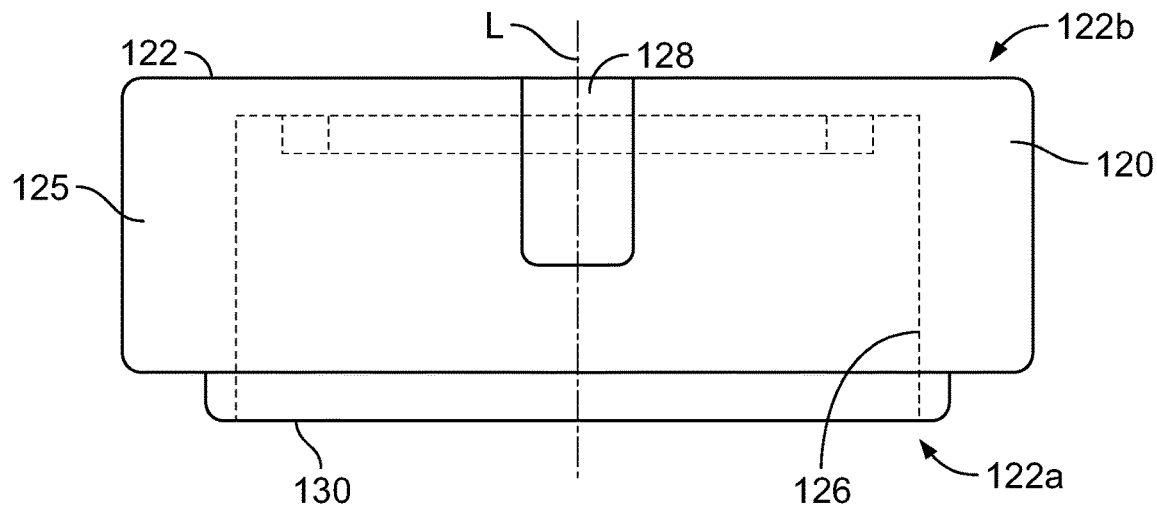
FIG. 7 illustrates a side elevation view of the example cap of FIGS. 4-6 in accordance with various embodiments.
Figure 8:
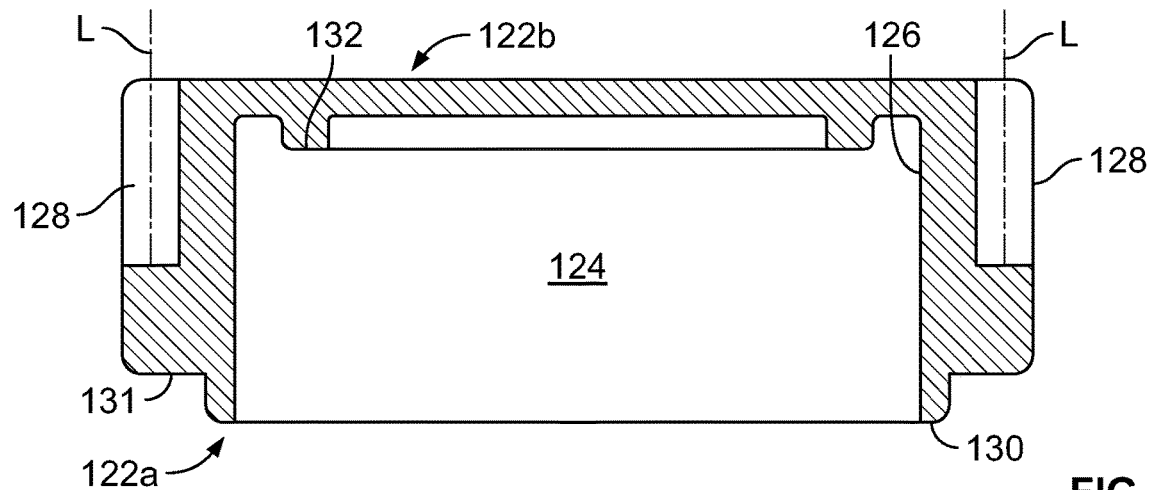
FIG. 8 illustrates a side cross-sectional elevation view of the example cap of FIGS. 4-7 in accordance with various embodiments.

As illustrated in FIGS. 2a-3, the system 100 also includes an electronic process control device 140 having a first end 140a, a second end 140b, wiring 142, and can incorporate any number of electrical components (e.g., switches, sensors, transducers, etc.). As illustrated in FIG. 2b, the electronic process control device 140 is inserted into the interior volume 105 of the housing body 103, and the wiring 142 is inserted through the opening 108 of the housing body 103. In some examples, the first end 140a of the electronic process control device 140 has a generally circular shape that may rest on and/or may be coupled to the ledge 106 of the housing body 103 using any number of suitable approaches.

Turning to FIGS. 4-8, the cap 120 includes a cap body 122 having a first end 122a and a second end 122b. The cap body 122 includes an inner surface 123 that at least partially defines an interior volume 124 and further includes an exterior surface 125. A cap threaded portion 126 is formed on the inner surface 123. The cap body 122 further includes at least one groove 128 formed on the exterior surface 125 and a coupling portion 130 formed at the first end 122a thereof. While the illustrated cap 120 is generally cylindrical, other shapes and/or configurations may be used.

In the illustrated example, the cap 120 is dimensioned to accommodate at least a portion of the housing 102. However, in other examples, the cap 120 may be dimensioned to be inserted into a portion of the housing 102. Nevertheless, the cap threaded portion 126 has a thread pitch that matches a thread pitch of the housing threaded portion 104 such that the cap 120 may be threadably coupled to the housing 102.

In the illustrated example, two grooves 128 are provided and are positioned radially about the exterior surface 125 of the cap body 122. The grooves 128 have an elongated shape extending along a longitudinal axis "L", and are spaced approximately 180° apart from each other, though other spacing and number of grooves may be used. The grooves 128 have a generally circular or arcuate shape that disturb the continuity of the exterior surface 125 of the cap body 122 such that the grooves 128 form a generally concave portion on the cap body 122. The grooves 128 may take any number of desired cross-sectional shapes such as, for example, triangular, rectangular, tapered, and the like. Other examples are possible.

As previously noted, the coupling portion 130 of the cap 120 extends outwardly from the first end 122a of the cap body 122. The illustrated coupling portion 130 is in the form of a continuous annular extension that extends outwardly from a ledge 131 of the cap body 122. It is appreciated that any arrangement of non-continuous segments may be used. The coupling portion 130 has a wall thickness "t1" that is less than the thickness "t2" of the remainder (or a portion) of the cap body 122, and as such, may be more malleable or deformable than the remainder and/or a portion of the cap body 122.

The second end 122b of the cap body 122 may further include an inner annular protrusion 132 that is dimensioned to accommodate a sealing member such as an O-ring 134. The O-ring 134 may be constructed from a resilient material that, in a relaxed state, may have an inner diameter that is less than an outer diameter of the inner annular protrusion 132. Accordingly, upon stretching the O-ring 134 around the inner annular protrusion 132, the O-ring 134 will be stretched, and thus will exert a compressive force against the inner annular protrusion 132 to remain secured to the cap body 122.

Figure 9:
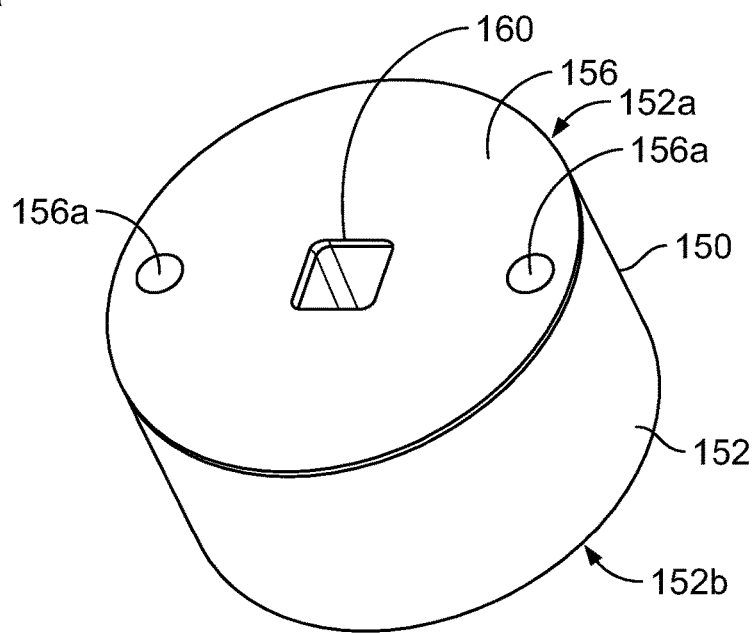
FIG. 9 illustrates an upper perspective view of an example application tool for securing the example tamper proof enclosure of FIGS. 1 and 2 in accordance with various embodiments.
Figure 10:
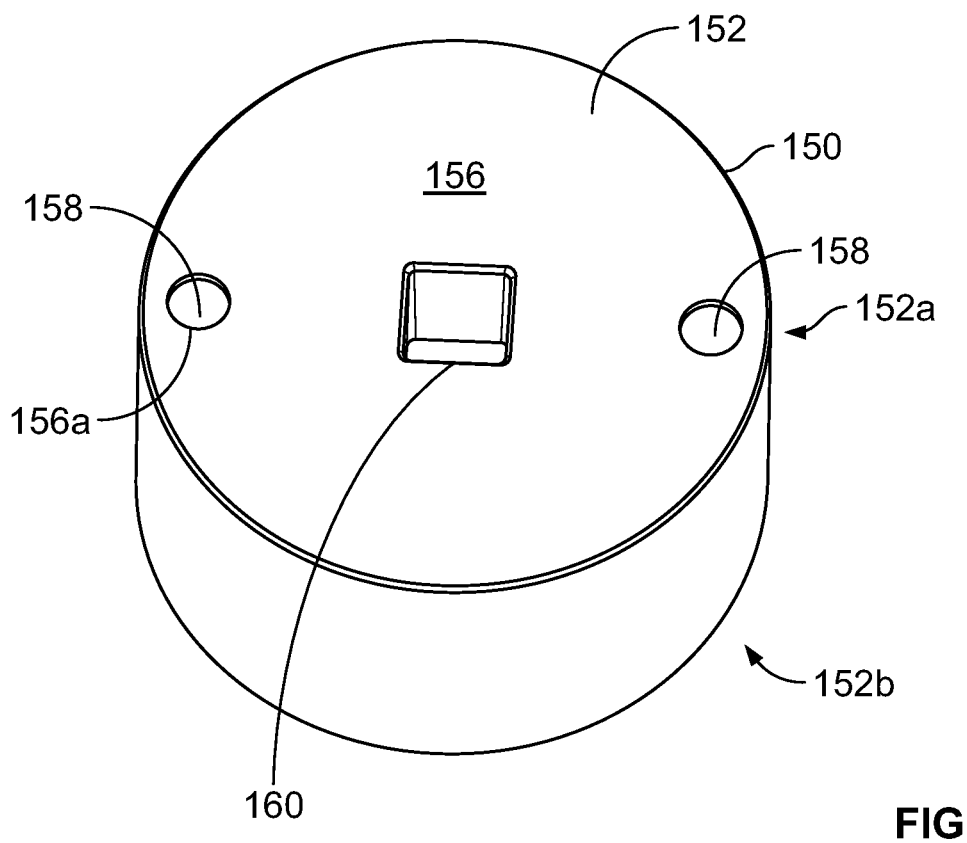
FIG. 10 illustrates an upper perspective view of the example application tool of FIG. 9 having a plurality of protrusions for securing the cap to the housing in accordance with various embodiments.
Figure 11:
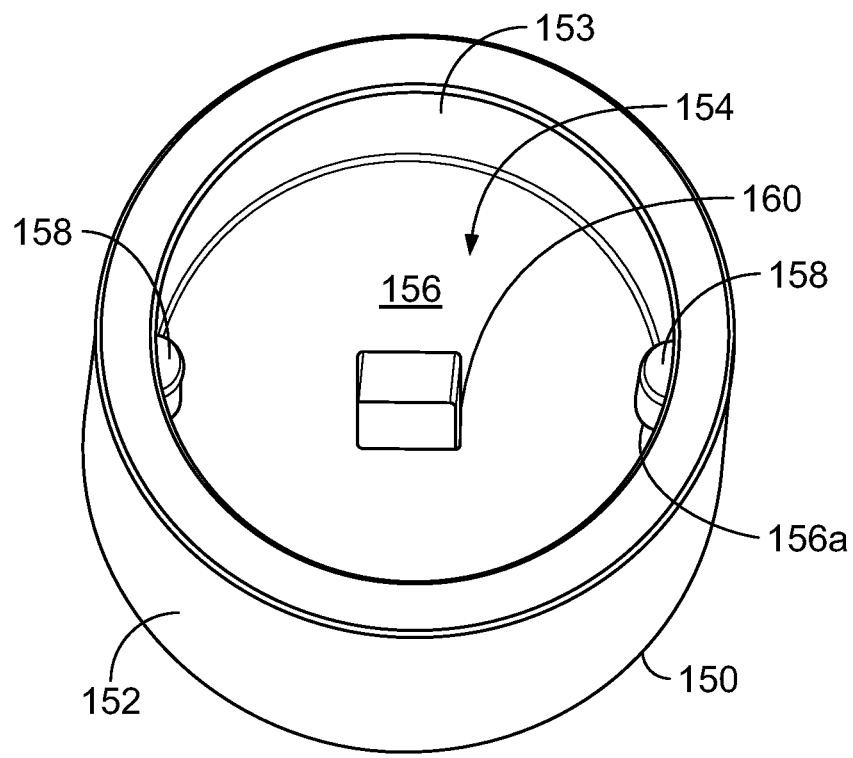
FIG. 11 illustrates a lower perspective view of the example application tool of FIGS. 9 and 10 in accordance with various embodiments.

Turning to FIGS. 9-11, the system 100 further includes an application tool 150 that includes an application tool body 152 having a first end 152a and a second end 152b. The application tool body 152 further includes an inner surface 153 that at least partially defines an interior volume 154. The first end 152a of the application tool body 152 defines a wall 156 that includes at least one protrusion opening 156a that extends at least partially through the wall 156 and into the interior volume 154.

In the illustrated example, the at least one protrusion opening 156a is dimensioned to accommodate a protrusion or dowel pin 158. The illustrated protrusion opening 156a is generally cylindrical in shape, having a generally circular cross-section, but any desired shape and/or configuration (that corresponds to the shape and/or configuration of the groove 128 formed on the cap body 122) may be used. In the illustrated example, the protrusion opening 156a is positioned to partially extend through the inner surface 153 of the application tool body 152 such that a channel is formed on the inner surface 153. In other examples, however, the protrusion opening 156a may be positioned such that it does not intersect with and/or form a channel on the inner surface 153 of the application tool body 152.

As shown in FIGS. 10 and 11, the dowel pin 158 is inserted into the protrusion opening 156a. This coupling may be a press fit or friction fit connection, a threaded connection, or any other suitable type of coupling such as via magnets, welds, adhesives, and the like. In other examples, the dowel pin 158 may be formed integrally with the application tool body 152, thus obviating the need for the protrusion opening 156a. In any of these configurations, the dowel pin 158 may extend any desired distance between the first and second ends, depending on the particular configuration and/or dimensions of the cap 120.

The wall 156 additionally defines a socket coupling mechanism 160. In the illustrated example, the socket coupling mechanism 160 is in the form of an opening or drive socket that can accept a drive square having any number of desired dimensions. For example, the drive socket may be a standard ⅜" or ½" opening. Other examples are possible. Further, in some examples, the socket coupling mechanism 160 may be in the form of the male drive square that is inserted into a corresponding drive socket.

Figure 12:
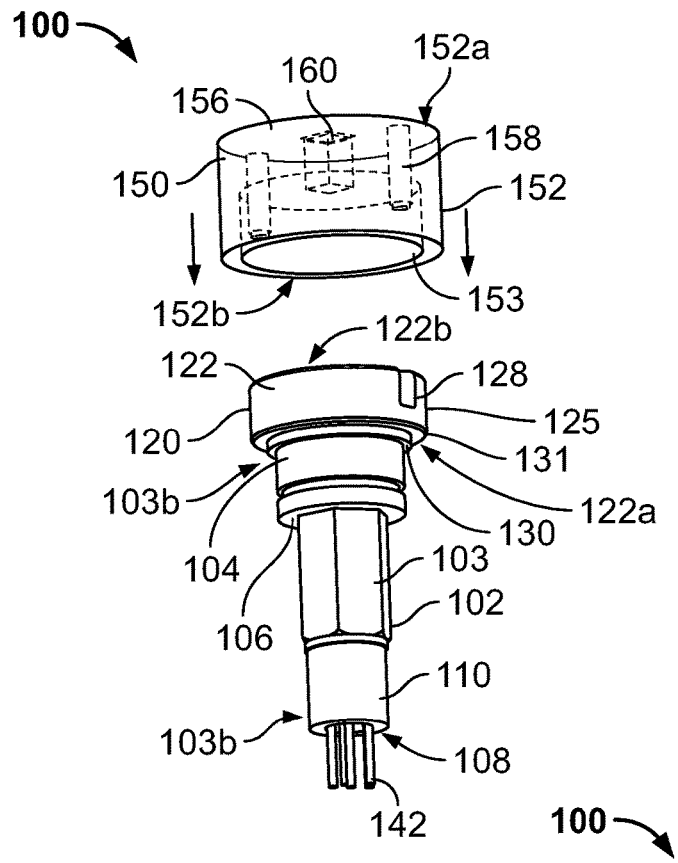
FIG. 12 illustrates a perspective view of the example alignment tool being placed on the example cap in accordance with various embodiments.
Figure 13:
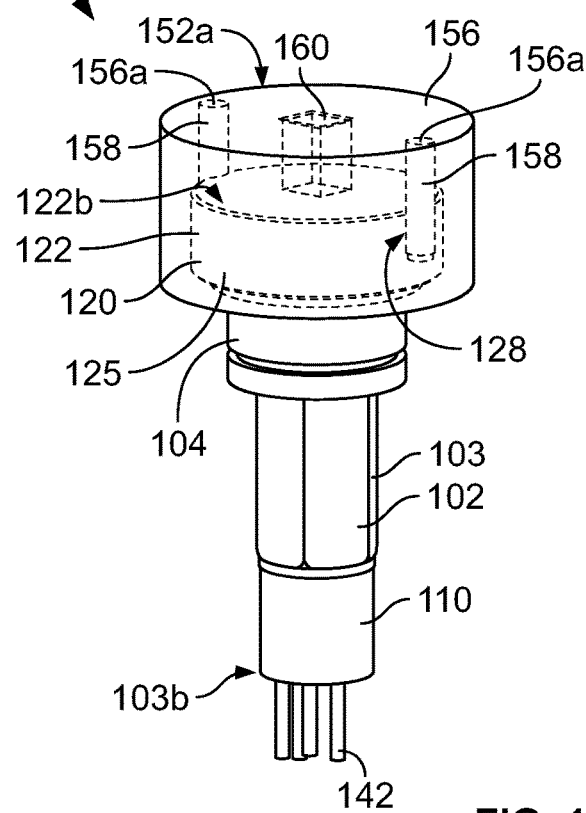
FIG. 13 illustrates a perspective view of the example alignment tool coupled to the example cap in accordance with various embodiments.
Figure 14:
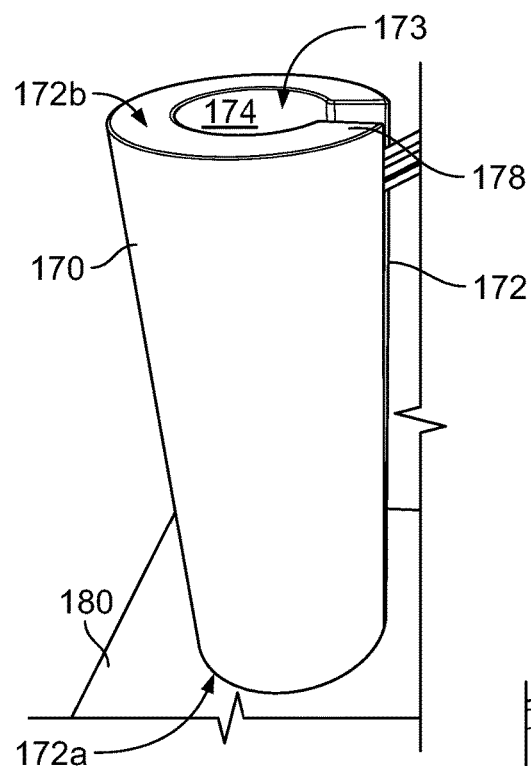
FIG. 14 illustrates an upper perspective view of an example securing tool for the example tamper proof enclosure in accordance with various embodiments.
Figure 15:
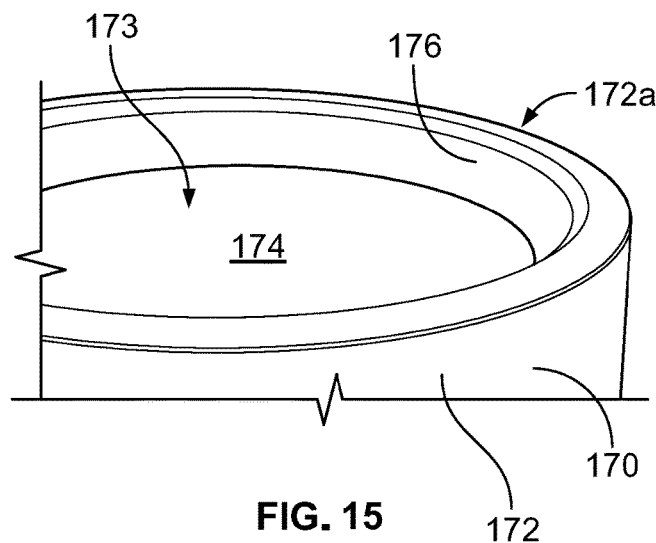
FIG. 15 illustrates a lower perspective view of the example securing tool of FIG. 14 in accordance with various embodiments.
Figure 16:
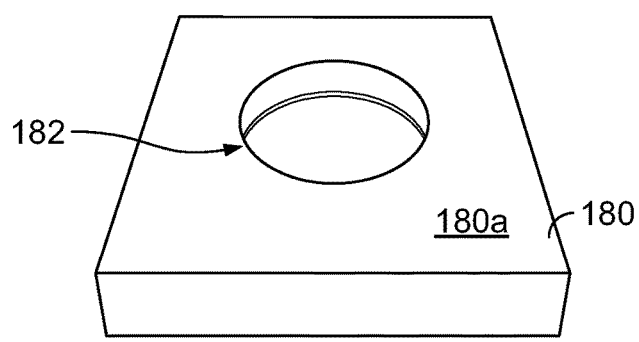
FIG. 16 illustrates a perspective view of an example base plate for the example tamper proof enclosure in accordance with various embodiments.

Turning to FIGS. 12 and 13, as previously noted, the dowel pin 158 has an opposite, but similar general shape as the groove 128, and is dimensioned to be slightly smaller than the groove 128 such that it may be insertable and/or nested therein. Further, the inner surface 153 of the application tool body 152 may have a slightly larger diameter (or other non-circular dimension) than an outer diameter of the exterior surface 125 of the cap body 122 so that the interior volume 124 of the cap 120 can accommodate at least a portion of the application tool body 152.

If desired, the cap 120 may be initially hand-threaded onto the housing 102. The cap 120 is dimensioned such that inner annular protrusion 132 surrounds a portion of the first end 140a of the electronic process control device 140, and as such, the O-ring 134 may provide additional environmental sealing of the interior volumes of the housing 102 and the cap 120. For example, the housing 102 and the cap 120, when secured to each other, may be IP54 rated in addition to adhering to the previously-noted safety standards and/or classifications.

The application tool 150 is then aligned with the cap 120, meaning the dowel pin 158 is axially aligned with the longitudinal axis L of the groove 128, and is then placed onto the cap 120. An operator may then secure the cap 120 to the housing 102 by rotating the cap 120 using a wrench inserted into the socket coupling mechanism 160 and applying a desired torque (e.g., between approximately 30 lbf-ft and approximately 70 lbf-ft). As the application tool 150 (and the dowel pin 158) rotates, the dowel pin 158 engages the surface of the groove 128 on the cap 120 to cause the cap 120 to be threaded onto the housing 102. As a result, a primary seal is formed having a treacherous path defined by the length of the engaged threads of the housing threaded portion 104 and the cap threaded portion 126 (and additionally, in some examples, the sealing generated via the O-ring 134).

So configured, the system 100 requires a specialized application tool 150 to secure (and gain access to) the housing 102 and the cap 120, thereby reducing and/or eliminating likelihood of an operator confusing the cap 120 with another component of the controller 10 that may actually need to be accessed.

Turning to FIGS. 14-19, the system 100 includes an additional, secondary securing mechanism to restrict the cap 120 from being unthreaded from the housing 102. Specifically, a securing tool 170 is provided in the form of an elongated cylinder having a securing tool body 172 having a first end 172a and a second end 172b. The securing tool body 172 further includes an inner surface 173 that at least partially defines an interior volume 174. The first end 172a of the securing tool body 172 defines a securing portion in the form of an annular bevel 176 that extends around at least a portion of the securing tool body 172. In the illustrated example, the annular bevel 176 has a larger diameter at the first end 172a of the securing tool body 172, and progressively decreases in diameter when moving in a direction towards the second end 172b of the securing tool body 172. The securing tool body 172 may also define a slot 178 extending along a length thereof.

Figure 17:
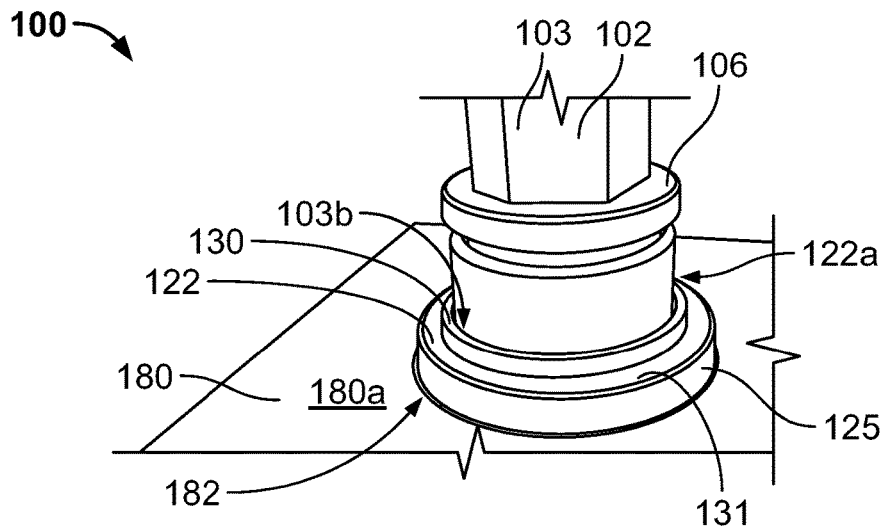
FIG. 17 illustrates a perspective view of the example tamper proof enclosure being disposed in the example base plate of FIG. 16 in accordance with various embodiments.
Figure 18:
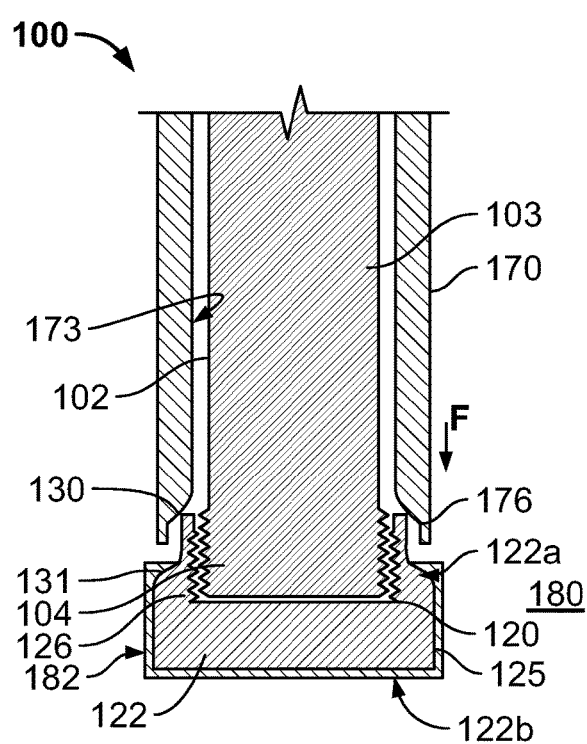
FIG. 18 illustrates a side cross-sectional elevation view of the example tamper proof enclosure disposed in the example base plate prior to securing the example cap to the example housing in accordance with various embodiments.
Figure 19:
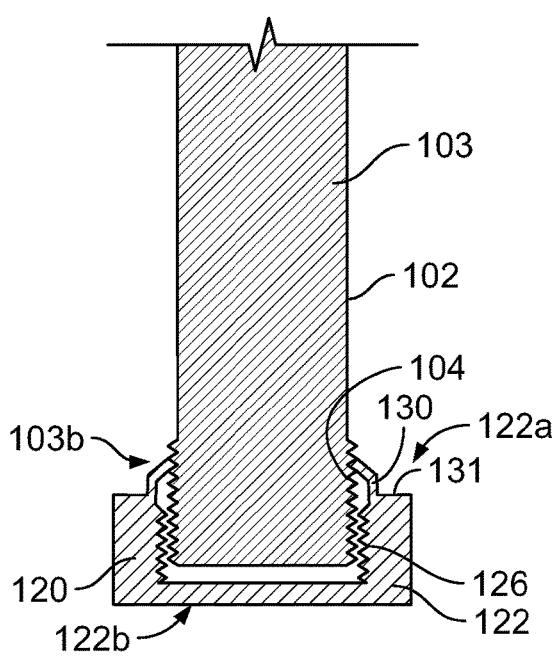
FIG. 19 illustrates a side cross-sectional elevation view of the example tamper proof enclosure upon the example cap being secured to the example housing in accordance with various embodiments.

The securing tool 170 further includes a base plate 180 having a countersunk region 182 extending downwardly from an upper surface 180a thereof. The countersunk region 182 is generally circular, and has a diameter that is slightly greater than an outer diameter (or other non-circular dimension) of the cap body 122. As illustrated in FIGS. 17-19, the second end 122b of the cap body 122 may be placed inside of the countersunk region 182 of the base plate 180. Because the inner surface 173 of the securing tool body 172 has a larger inner diameter than an outermost diameter of the housing 102 and an outermost diameter of the coupling portion 130, the securing tool body 172 may be placed over the housing 102 and the first end 122a of the cap body 122.

More specifically, the first end 172a of the tool body 172 is placed onto the housing 102 and the cap 120 such that the annular bevel 176 rests against the coupling portion 130 of the cap body 122. To avoid damage, the wiring 142 may be routed through the slot 178.

A pressing mechanism (not shown) such as a hydraulic press may then be positioned adjacent to the second end 172b of the securing tool body 172 and may exert an urging force onto the securing tool body 172. This urging force causes the annular bevel 176 to press against the coupling portion 130 and crimp or deform the coupling portion inwardly and into engagement with the housing body 103 (e.g., the housing threaded portion 104) and may or may not come into contact with the ledge 131. In some examples, the coupling portion 130 may itself press into the housing body 103 and create a deformed region thereon. In some examples, the pressing tool may exert an urging force between approximately 4,000 psi and approximately 10,000 psi.

Put differently, upon being pressed, the outermost end 130a of the coupling region 130 may have an inner diameter that is decreased and is resultantly less than the diameter of the housing threaded portion 104 to create interference with the housing threaded portion 104. As a result, absent destructive forces, the cap 120 is permanently affixed to the housing 102, thus precluding the cap 120 from being inadvertently removed. In some examples, the coupling region 130 may "bite" a portion of threads on the housing threaded portion 104 to form a stronger interference fit. However, in other examples, most or all of the outermost end 130a of the coupling region 130 may instead engage the housing body 103 and not the housing threaded portion 104.

So configured, the tamper proof control system 100 described herein may allow for a more secure environment that adheres to explosion-proof (or any other) safety standards while reducing the possibility of inadvertently accessing the sealed inner volume. The system 100 may use any number of alternative arrangements such as, for example, a housing having a coupling portion that is deformed or crimped into engagement with a cap body.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

The patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed is:
1. A tamper proof control system comprising:
a housing including a housing body having a first end having a housing threaded portion, the housing body defining an interior volume to accommodate an electronic process control device;
a cap including a cap body defining an interior volume and including a proximal end, a cap threaded portion, an exterior surface, and at least one groove formed on the exterior surface, the proximal end of the cap body defining a coupling portion;

wherein upon threadably securing the cap to the housing, the coupling portion of the cap engages the housing threaded portion to restrict relative rotation between the housing and the cap.

2. The system of claim 1, further comprising an application tool having an application tool body defining an interior volume to accommodate at least a portion of the cap body and at least one protrusion extending from a surface of the application tool body, the cap being adapted to be placed within the interior volume of the tool body such that the at least one protrusion of the application tool body is axially aligned with the at least one groove of the cap body.

3. The system of claim 2, wherein the at least one protrusion of the application tool exerts a torque on the at least one groove of the cap to threadably secure the cap to the housing.

4. The system of claim 2, further comprising a securing tool having a securing tool body and a first end having a securing portion, the securing tool body defining an interior volume to accommodate at least a portion of the housing, wherein upon inserting the housing into the interior volume of the securing tool body, the securing portion is adapted to engage the coupling portion of the cap to urge the coupling portion of the cap into engagement with the housing threaded portion.

5. The system of claim 4, wherein the securing portion includes an annular bevel extending around at least a portion of the securing tool body.

6. The system of claim 4, wherein an urging force is exerted on the securing tool to urge the coupling portion of the cap into engagement with the housing threaded portion, wherein the urging force is between approximately 4,000 psi and approximately 10,000 psi.

7. The system of claim 1, wherein the at least one groove forms a circular cross section.

8. The system of claim 1, further comprising a plurality of grooves formed on the cap body, the plurality of grooves positioned radially about the exterior surface of the cap body.

9. The system of claim 1, further comprising a seal member positioned within the interior volume of the cap body to seal the interior volume thereof.

10. The system of claim 1, further comprising an electronic process control device at least partially disposed within the interior volume of the housing and the interior volume of the cap.

11. The system of claim 1, wherein the coupling portion of the cap body has a first thickness and at least a portion of the remainder of the cap body has a second thickness, wherein the first thickness is less than the second thickness.

12. A method of sealing a tamper proof device, the method comprising:
placing at least one electronic process control device within an interior volume of a housing, the housing further including a housing body having a first end having a housing threaded portion;
providing a cap including a cap body defining an interior volume and including a proximal end, a cap threaded portion, an exterior surface, and at least one groove formed on the exterior surface, the proximal end of the cap body defining a coupling portion;
threadably coupling the housing threaded portion to the cap threaded portion; and
urging the coupling portion of the cap body into engagement with the housing threaded portion such that relative rotation between the housing and the cap is restricted.

13. The method of claim 12, wherein the step of threadably coupling the housing threaded portion to the cap threaded portion comprises inserting at least a portion of the cap into an interior volume of an application tool having an application tool body and at least one protrusion extending from a surface of the application tool body, wherein the at least one protrusion of the application tool body is axially aligned with the at least one groove of the cap body.

14. The method of claim 13, further comprising exerting a torque on the at least one groove of the cap via the application tool.

15. The method of claim 13, wherein the step of urging the coupling portion of the cap body into engagement with the housing threaded portion comprises inserting at least a portion of the housing into an interior volume of a securing tool having a securing tool body and a first end forming a securing portion, wherein the securing portion engages and urges the coupling portion of the cap into engagement with the housing threaded portion.

16. The method of claim 15, wherein the securing portion of the securing tool exerts a force of between approximately 4,000 psi and approximately 10,000 psi on the coupling portion of the cap.

17. The method of claim 12, wherein upon threadably coupling the housing to the cap, at least a portion of the electronic process control device is disposed within the interior volume of the cap.

18. The method of claim 12, further comprising providing a sealing member to sealingly engage the interior volume of the housing and the interior volume of the cap body relative to an external environment.

* * * * *